United States Patent [19]
Konishi et al.

[11] Patent Number: 4,746,961
[45] Date of Patent: May 24, 1988

[54] FIELD EFFECT TRANSISTOR

[75] Inventors: Nobutake Konishi, Hitachiota; Kenji Miyata, Katsuta; Yoshikazu Hosokawa, Hitachiota; Takaya Suzuki; Akio Mimura, both of Katsuta, all of Japan

[73] Assignee: Hitachi, Ltd., Tokyo, Japan

[21] Appl. No.: 59,785

[22] Filed: Jun. 8, 1987

[30] Foreign Application Priority Data

Jun. 11, 1986 [JP] Japan .............................. 61-133689

[51] Int. Cl.<sup>4</sup> .................. H01L 29/78; H01L 27/12; H01L 29/161; H01L 29/12
[52] U.S. Cl. ........................... 357/23.7; 357/4; 357/16; 357/58
[58] Field of Search ................ 357/4, 4 SL, 23.7, 16, 357/58

[56] References Cited

U.S. PATENT DOCUMENTS 4,065,781 12/1977 Gutknecht ..................... 357/23.7
4,087,902 5/1978 Feltner ......................... 357/23.7
4,199,773 4/1980 Goodman et al. ............... 357/23.7

OTHER PUBLICATIONS

Onga et al. "Characterization of Polycrystalline Silicon MOS Transistors and Its Film Properties," Japanese Journal of Applied Physics vol. 21 No. 10 Oct. 1982 pp. 1472–1478.

Primary Examiner—Martin H. Edlow
Assistant Examiner—Robert P. Limanek
Attorney, Agent, or Firm—Antonelli, Terry & Wands

[57] ABSTRACT

This invention relates to the structure of a field effect transistor, which is suitable for liquid crystal display of an active matrix scheme and there is disclosed a new structure for the field effect transistor, in which at least one of the source region and the drain region is of multi-layered structure, in which high impurity concentration portions and low impurity concentration portions are alternately superposed on each other.

7 Claims, 5 Drawing Sheets

FIELD EFFECT TRANSISTOR

BACKGROUND OF THE INVENTION

This invention relates to a field effect transistor and in particular to the structure of a field effect transistor, which is suitable for active matrix addressed liquid crystal display.

As a thin film field effect transistor (hereinbelow abbreviated as TFT) for liquid crystal display the matrix control is easier and it is possible to obtain a display having a higher quality with increasing on/off-current ratio. The on-current is determined principally by the size of the TFT and the field-effect mobility in the channel region. It is believed that the off-current is determined principally by the size of the TFT, and the resistivity and the crystallinity of the semiconductor layer constituting the channel region, but beside them it includes a component determined by the quality of the p-n junctions between the source and drain regions and the channel region.

Next, problems in the prior art techniques will be concretely explained by using an example illustrating the construction of a prior art TFT indicated in FIG. 1 and an example of its drain current ($I_D$)-gate voltage ($V_G$) characteristics. As indicated in FIG. 1, an n+ source region 3 and an n+ drain region 4 are formed in a non doped polycrystalline Si layer disposed on an insulating substrate 1 by the ion implantation method. A gate insulating film 5 and a gate electrode 6 are disposed right above a channel region 2, where no ions are implanted. When a voltage $V_G>0$ is applied to the gate electrode 6, the surface portion 200 of the channel region 2 right below the gate insulating film 5 is changed into n conductivity type and a drain current $I_D$ flows between the source region 3 and the drain region 4. On the contrary, when a voltage $V_G<0$ is applied thereto, the surface portion 200 is changed into p conductivity type and consequently no drain current $I_D$ should flow therebetween, as indicated by the curve (a) in FIG. 2. However, in reality, a current as indicated by the curve (b) in FIG. 2 flows therebetween. This is because the electric field at the interface 201 of the drain junction, which is reverse biased, increases with increasing $V_G$, which increases the leak current through this junction. In the case where a TFT is formed wholly with a monocrystal, since it is possible to form a drain junction having a good crystallinity leak current through this junction is negligibly small. On the contrary, in the case where a TFT is formed with polycrystalline Si, amorphous Si, etc., since there exist a number of trap levels at grain boundaries at the neighborhood of the junction, leakage current therethrough cannot be neglected. This means substantially that the on/off-current ratio is reduced and thus such a TFT is not preferable for the liquid crystal display.

Such a problem is provoked also in the case where a voltage $V_D$ is applied to the source region and the drain region is grounded. Concerning this problem, in Japanese Journal of Applied Physics Vol. 21, No. 10, 1982 pp. 1472-1478, it is discussed that in a usual coplanar type polycrystalline Si TFT, where the source region (S) and the drain region (D) are formed at the two ends, respectively, leakage current is extraordinary great, when a reverse voltage is applied to the gate, and this is provoked by junction breakdown of the drain region due to crystalline imperfection in polycrystalline silicon. JP-A No. 58-171860 can be cited as a publication disclosing measures for solving this problem, where among a plurality of TFTs at least two of them are connected in series, whose gate electrodes are connected in common so that they work as if they were a TFT. Therefore the device disclosed in the publication has a problem that integration is difficult because of a large number of necessary transistors.

SUMMARY OF THE INVENTION

An object of this invention is to provide a field effect transistor having reduced drain current and leakage current, when a gate voltage is at the proximity of zero and when a reverse gate voltage is applied, without degrading its on-characteristics.

Another object of this invention is to provide a field effect transistor having a large on/off-current ratio and facilitating the control of the matrix for active matrix addressed liquid crystal display.

This invention is characterized in that at least one of the source and drain regions has a structure, in which high impurity concentration regions and low impurity concentration regions are superposed alternately. Here the expression "low impurity concentration portions" includes portions, which are intrinsic semiconductor.

In the structure according to this invention, even if a reverse gate voltage is applied to the gate electrode of a field effect transistor, since the voltage applied to the junction between the source or drain region and the channel region is shared among the superposed high and low impurity concentration portions, it is possible to supress increase of the leakage current flowing through the junction having a dependence on the voltage applied thereto. Consequently a field effect transistor can be obtained, which has a substantially large on/off-current ratio.

Here it is desirable that the high impurity concentration portions have an impurity concentration greater than $1\times10^{18}$ cm$^{-3}$, preferably $1\times10^{20}$ cm$^{-3}$ and that the low impurity concentration portions have an impurity concentration smaller than $1\times10^{17}$ cm$^{-3}$, preferably $1\times10^{15}$ cm$^{-3}$ or they may be intrinsic semiconductor.

Further it is desirable that the portion of the alternately superposed multi-layered structure, which is adjacent to the source (drain) electrode, is a high impurity concentration layer in order to form an ohmic contact therewith. Consequently it is preferable that at least two high impurity concentration portions are superposed.

In the junction formed by alternately superposing the high and low impurity concentration portions, it is necessary that its end portions are exposed at the surface of the semiconductor layer. In this case, when the end portions terminate at an insulating layer having a surface stabilizing function, the interface between the insulating layer and the semiconductor layer is the surface of the semiconductor layer.

Other objects and features of this invention will be clear from the explanation of the embodiments described below.

DESCRIPTION OF THE PREFERRED EMBODIMENTS

Hereinbelow the construction of TFTs according to this invention will be explained more in detail by using the embodiments indicated in the figures.

[Embodiment 1]

Figure 1:
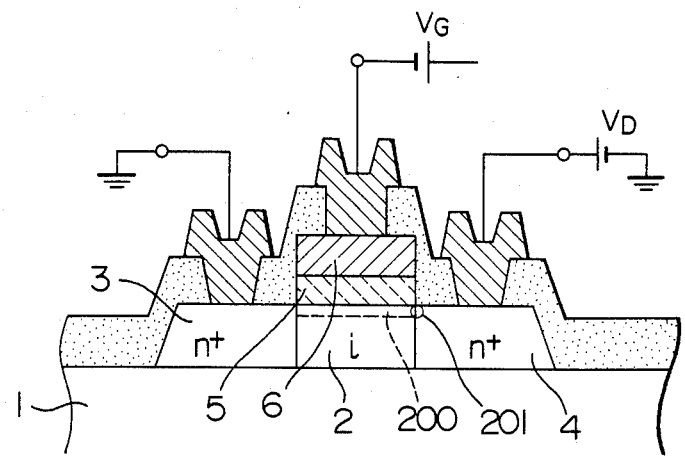
FIG. 1 is a cross-sectional view illustrating the construction of a prior art TFT.
Figure 2:
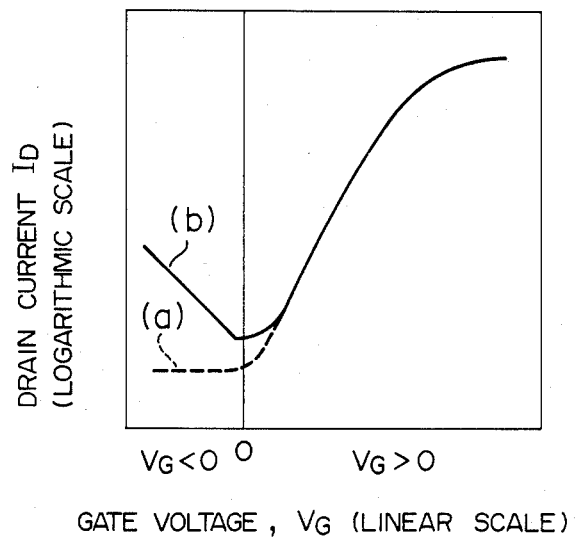
FIG. 2 shows gate voltage-drain current characteristics of the TFT indicated in FIG. 1.
Figure 3:
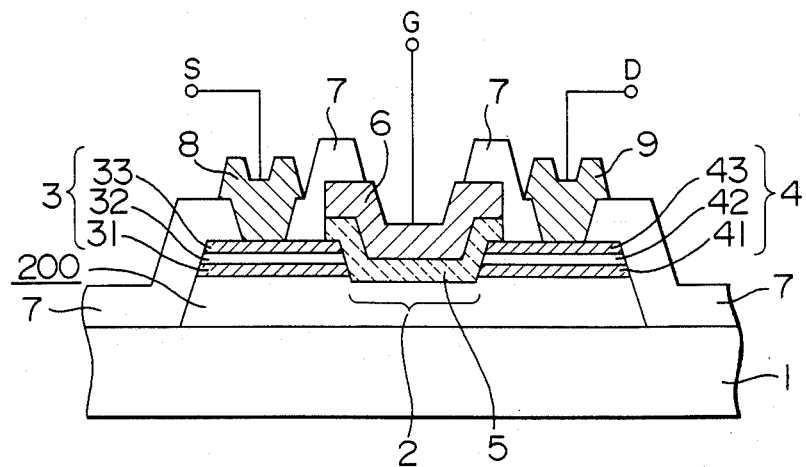
FIG. 3 is a longitudinal cross-sectional view of a TFT according to a first embodiment of this invention.
Figure 4:
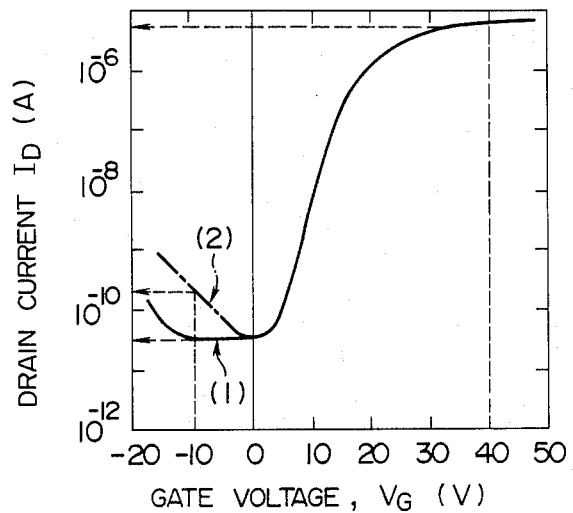
FIG. 4 shows gate voltage-drain current characteristics of the TFT indicated in FIG. 3.

FIG. 3 is a cross-sectional view indicating a TFT 200 according to a first embodiment of this invention, in which the items identical or corresponding to those in the prior art TFT indicated in FIG. 1 are represented by the same reference numerals. The TFT 200 consists of a polycrystalline Si layer having a channel region 2, a source region 3 and a drain region 4 and disposed on an insulating substrate 1 made of glass, quartz, etc., a gate insulating film 5, a gate electrode 6, an interlayer insulating film 7, a source electrode 8 and a drain electrode 9. One of the most important features of this invention is that each of the source region 3 and the drain region 4 has a three-layered structure consisting of an n+ type high impurity concentration portion 31, 41, a non doped portion 32, 42 and an n+ type high impurity concentration portion 33, 43. The curve (1) in FIG. 4 shows gate voltage $V_G$ - drain current $I_D$ characteristics obtained for the TFT structure of the above embodiment and (2) indicates a corresponding curve obtained for the prior art structure illustrated in FIG. 1, where there is neither non doped portion 32, 42 nor n+ type high impurity concentration portion 31, 41, the latter being shown for comparison. In the case where an on/off-current ratio greater than five orders of magnitude is required as an example, in which TFTs are applied to a liquid crystal display, in a gate voltage region $V_G=0$ to 40 V both the curves (1) and (2) satisfy the required specification. However, when a liquid crystal display is driven in practice, sometimes the gate is biased to about $-10$ V. Since also at this time the on/off-current ratio greater than five orders of magnitude is required, the prior art structure (curve (2)) cannot satisfy the specification. It can be verified that with the structure of this embodiment (curve (1)), in a gate voltage region $V_G = -10$ to $+40$ V the on/off-current ratio described above can be amply obtained. This is due to the fact that since the voltage applied to a p conductivity type inversion layer due to positive holes induced in the channel region 2, when the gate is reverse biased, and the n+ type high impurity concentration portion of the drain region 4 is shared between the p-n junction of the channel region 2 and the n+ high impurity concentration portion 41 and that of the non doped portion 42 and the n+ high impurity concentration portion 43, the component of the current depending on the electric field applied to the p-n junctions is reduced.

Figure 5A:
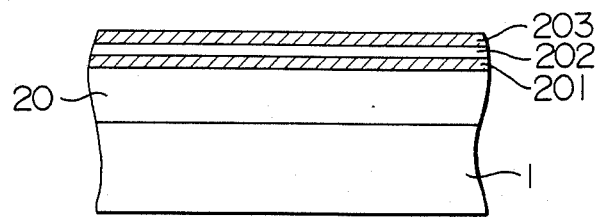
FIGS. 5A to 5F are longitudinal cross-sectional views showing the fabrication steps of the TFT indicated in FIG. 3.

Now an example of the fabrication method for the above embodiment will be explained, referring to FIGS. 5A to 5F. At first a polycrystalline silicon film 20 is deposited to a thickness of 150 to 500 nm on a glass substrate 1 by the reduced pressure CVD method or by the plasma CVD method at a formation temperature lower than 600° C. After that, an n+ high impurity concentration layer 201 is deposited to a thickness of about 50 nm by using $PH_3$ as dopant, a layer 202 non doped similarly to a polycrystalline film 20 to a thickness of about 50 nm and finally an n+ layer 203 of high impurity concentration similar to the n+ layer 201 to a thickness of about 50 nm (FIG. 5A).

Figure 5B:
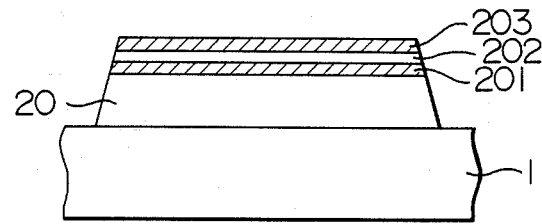
Figure 5C:
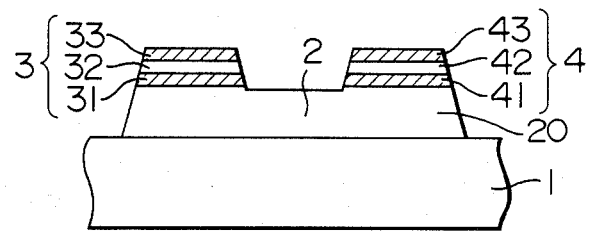
Figure 5D:
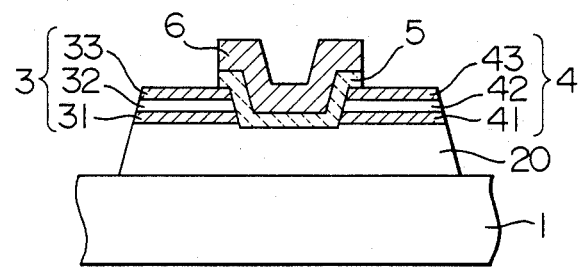
Figure 5E:
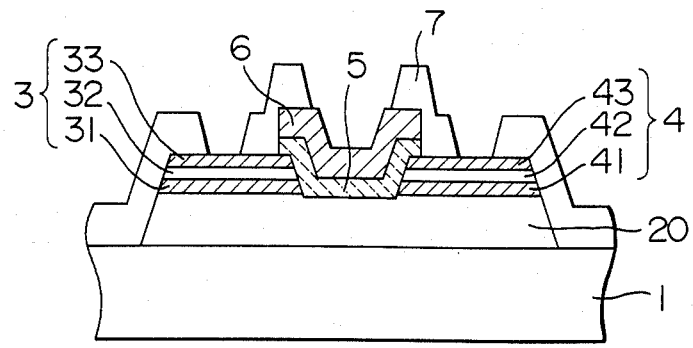
Figure 5F:
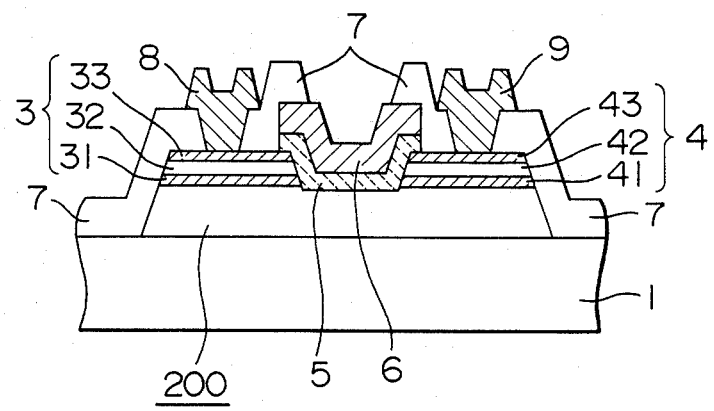

Then these layers are formed into a predetermined mesa-shape by the dry etching techniques (FIG. 5B). After that, the portion which will be the channel region 2 is exposed by removing the layers 31, 32 and 33 superposed thereon by dry etching techniques. Subsequently an $SiO_2$ layer 5 serving as the gate insulating film is deposited to a thickness of 100 to 150 nm by the CVD method and further an n+ type polycrystalline Si or amorphous Si layer 6 serving as the gate electrode is deposited to a thickness of 150 to 350 nm by using $PH_3$ as dopant, these layers being formed into a predetermined shape by the dry etching techniques (FIG. 5D). Further a PSG (abbreviation of Phosphosilicate glass) layer 7 is deposited to a thickness of about 600 nm as an interlayer insulating film and through holes for contact with the source, the drain and the gate electrode are formed (FIG. 5E). Finally an Al-Si layer is deposited to a thickness of 600 to 800 nm by sputtering and the source electrode 8 and the drain electrode 9 are formed to complete a TFT 200 (FIG. 5F). In the case where TFTs 200 are applied to a liquid crystal display, since they are arranged in a matrix form, it is necessary to dispose X - Y wiring connecting them, but since this has nothing to do with this invention, their explanation will be omitted.

According to this fabrication method described above, in the fabrication step indicated in FIG. 5A, since it is possible to superpose these layers 20, 31, 32 and 33 successively on each other without exposing them to the atmosphere, the junctions between two of them, which remain always clean, can be formed and thus an effect can be obtained that it is possible to reduce extremely the leak current due to contamination substance. Further, since the source region 3 and the drain region 4 are constructed by superposing different layers, using doping gas such as $PH_3$, etc., it is possible basically to obtain a TFT including lighter damage given to the polycrystalline Si layer 20, which is the underlayer, and thus more excellent in junction characteristics in comparison with the structure, for which high impurity concentration layers are formed by the ion implantation method.

[Embodiment 2]

Figure 6:
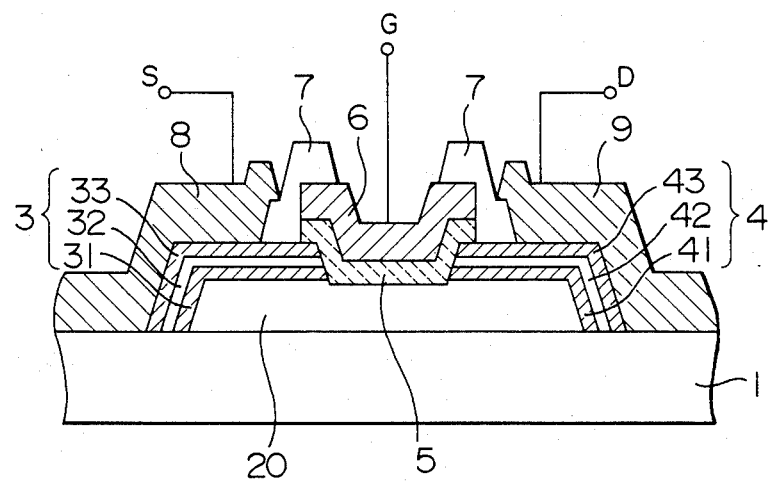
FIG. 6 is a longitudinal cross-sectional view of a TFT according to a second embodiment of this invention.

FIG. 6 is a longitudinal cross-sectional view of a TFT, which is a second embodiment of this invention. In FIG. 6 the identical or corresponding items to those in FIG. 3 are indicated by the same reference numerals. One of the most important features of the structure of this embodiment is that the source and drain regions 3 and 4 are surrounded by the three portions of n+ i n+ also at their side surface. Since the structure, which is in contact with the gate insulating film 5 is completely identical to that of the first embodiment indicated in FIG. 3, gate voltage-drain current characteristics obtained are almost identical. According to this embodiment at first a polycrystalline-Si layer 20 is deposited to a thickness of 150 to 500 nm and the layer 20 is formed into a predetermined mesa shape by the dry etching method. After that, the n+ portion, non-doped portion (i portion) and n+ portion are superposed on each other and the n+ i n+ portions at the channel region are removed so that the source region 3 and the drain region 4 are formed. The TFT can be fabricated by the process completely identical to that in the first embodiment for the following steps.

According to this embodiment, since the source and drain regions are surrounded by the three portions of n+ i n+ also at their side surface, their contact area with the source electrode 8 and the drain electrode 9 can be large and thus their contact resistance can be reduced. Further another advantage can be obtained that no excessively high precision may be required for the through holes formed in the insulating film 7.

[Embodiment 3]

Figure 7:
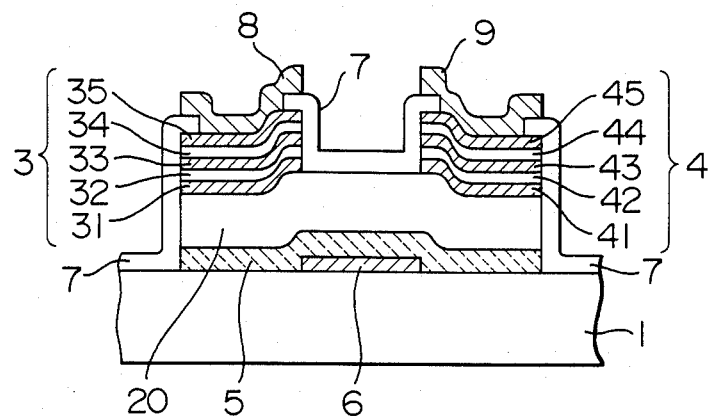
FIG. 7 is a longitudinal cross-sectional view of a TFT according to a third embodiment of this invention.

FIG. 7 shows another TFT, which is a third embodiment of this invention, having a structure called reverse stagger structure. A gate electrode 6 made of chromium or silicide is disposed on a glass substrate 1 and a silicon oxide or silicon nitride film 5, which is the gate insulating film, is formed thereon over the whole surface of the substrate 1. A polycrystalline silicon film 20 is formed on the gate insulating film 5. Further high and low impurity concentration layers are superposed thereon alternately, as indicated in FIG. 5, and thereafter the source region 3 and the drain region 4 are formed into a predetermined shape by etching. The two regions 3 and 4 include 3 high impurity concentration portions indicated by reference numerals 31, 33, 35 and 41, 43, 45 and 2 low impurity concentration portions indicated by reference numerals 32, 34 and 42, 44, respectively. The withstand voltage increases with increasing number of alternately superposed layers. Reference numeral 7 represents a silicon oxide or silicon nitride film serving as the interlayer insulating film and 8 and 9 indicate the source and the drain electrodes, respectively, having a multilayered structure of chromium and aluminium.

[Embodiment 4]

Figure 8:
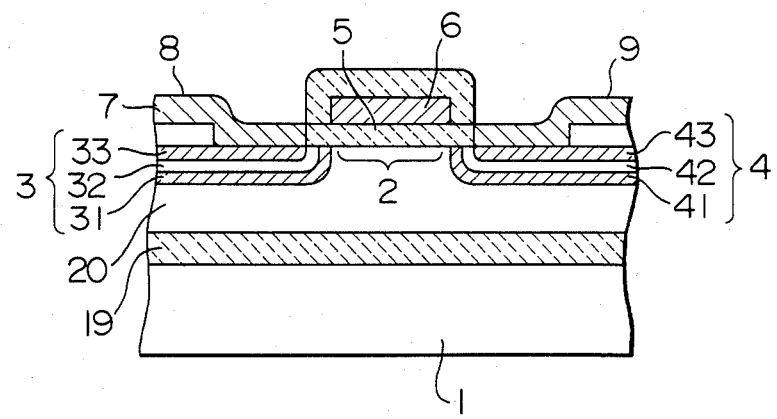
FIG. 8 is a longitudinal cross-sectional view of a TFT according to a fourth embodiment of this invention.

FIG. 8 shows still another TFT, which is a fourth embodiment of this invention, in which the junctions between the source and drain regions 3, 4 and the channel regions are of planar structure. In addition, the polycrystalline silicon layer 20 is disposed on a monocrystalline silicon substrate 1 through an insulating film 1a such as a silicon oxide film, a silicon nitride film, etc.

The high impurity concentration portions 31, 33, 41, 43 and the low impurity concentration portions 32, 42 of the source and drain regions 3, 4 can be formed by an appropriate method such as diffusion, a method, by which a polycrystalline silicon layer is removed by etching, remaining the portion which will be the channel region 2; layers, which will be the portions 31-33, 41-43, are superposed on each other by the CVD method, and finally the surface is flattened, etc.

Besides the identical or corresponding items to those in FIG. 3 are represented by the same reference numerals.

As indicated in FIGS. 6 to 8, this invention can be applied to TFTs of various structures.

This invention can be applied thereto either in the case where the source and drain regions and the channel region have a same conductivity type or in the case where they have different conductivity types.

The high and low impurity concentration portions constituting the channel region, the source and drain regions are not necessarily polycrystalline or amorphous. Since the portion where a polycrystalline layer and an amorphous layer are in contact with each other forms a heterojunction, which increases the barrier, it is possible to reduce further the leak current.

When an amorphous layer is used, if a hydrogenation treatment is effected to improve the crystallinity, it is possible to reduce further the leak current.

Although in the embodiments described above both the source and the drain regions are of alternately superposed multi-layered structure, only the junction portion of either one of them, which withstands the major part of the applied voltage, may be of alternately superposed multi-layered structure.

According to this invention, since the withstand voltage is increased, it is not necessary to use the prior art structure disclosed in JP-A No. 58-171860, where a plurality of TFTs are connected in series, as indicated in FIG. 1. Consequently, in the case where they are integrated, it is possible to reduce the number of required elements and thus to advance the improvement in the factor of integration. In the case where the field effect transistor according to this invention is applied to TFTs for the liquid crystal display, a good controllability and thus clearer images can be obtained. Furthermore, since leak current is small in the off-region, the life of the liquid crystal can be considerably elongated.

As explained in detail, according to this invention, since the source and the drain regions are of structure, in which high and low impurity concentration portions are alternately superposed on each other, when the reverse gate voltage is applied thereto, the electric field applied to the pn junctions is alleviated and thus leak current is reduced. Consequently it is possible to obtain an on/off-current ratio satisfactorily large with respect to that obtained with a TFT of prior art structure over a wide $V_G$ range.

We claim:

1. A field effect transistor comprising:
   a source region and a drain region formed in a semiconductor layer;
   a channel region disposed between said source region and said drain region in said semiconductor layer; and
   a gate electrode disposed opposite to said channel region through an insulating film;
   whereby at least one of said source region and said drain region is of multi-layered structure, in which high impurity concentration portions and low impurity concentration portions are alternately superposed on each other so that a high impurity concentration portion is in contact with said channel region and that another high impurity concentration portion is in contact with a source electrode and a drain electrode, respectively.

2. A field effect transistor according to claim 1, in which the interfaces forming junctions between said high impurity concentration portions and said low impurity concentration portions terminate at the surface of said semiconductor layer.

3. A field effect transistor according to claim 1, in which all of said source region, said drain region and said channel region are of either one of the p conductivity type and n conductivity type.

4. A field effect transistor according to claim 1, in which said high impurity concentration portions and said low impurity concentration portions of said source region and said drain region and the channel region are made of either one of amorphous and polycrystalline semiconductors alone or combinations thereof.

5. A field effect transistor according to claim 1, in which said low impurity concentration portions are in the intrinsic state.

6. A field effect transistor according to claim 1, in which said source region and said drain region are of first conductivity type and the channel region is of second conductivity type, which is opposite to said first conductivity type.

7. A field effect transistor according to claim 1, in which the number of said high impurity concentration portions constituting said alternately superposed multi-layered structure is at least three.

* * * * *